United States Patent
Harrington et al.

(10) Patent No.: US 9,837,259 B2
(45) Date of Patent: Dec. 5, 2017

(54) SEQUENTIAL ETCHING TREATMENT FOR SOLAR CELL FABRICATION

(71) Applicant: SUNPOWER CORPORATION, San Jose, CA (US)

(72) Inventors: Scott Harrington, Oakland, CA (US); Venkatasubramani Balu, Santa Clara, CA (US); Amada Lorena Montesdeoca Santana, Leuven (BE)

(73) Assignees: SunPower Corporation, San Jose, CA (US); Total Marketing Services, Puteaux (FR)

( * ) Notice: Subject to any disclaimer, the term of this patent is extended or adjusted under 35 U.S.C. 154(b) by 0 days.

(21) Appl. No.: 14/473,857

(22) Filed: Aug. 29, 2014

(65) Prior Publication Data

US 2016/0064207 A1     Mar. 3, 2016

(51) Int. Cl.
*H01L 21/02*     (2006.01)
*H01L 31/18*     (2006.01)

(52) U.S. Cl.
CPC .. *H01L 21/02019* (2013.01); *H01L 21/02052* (2013.01); *H01L 31/1804* (2013.01); *Y02E 10/547* (2013.01); *Y02P 70/521* (2015.11)

(58) Field of Classification Search
CPC ........... H01L 31/022425; H01L 21/306; H01L 2924/10253; H01L 21/30604;
(Continued)

(56) References Cited

U.S. PATENT DOCUMENTS 4,137,123 A * 1/1979 Bailey ............... H01L 21/30608
                                      136/256
6,090,726 A * 7/2000 Lee ....................... H01L 21/316
                                      257/E21.271
(Continued)

FOREIGN PATENT DOCUMENTS

JP          2004063744 A   *   2/2004
KR    10-2011-0076964       7/2011
(Continued)

OTHER PUBLICATIONS

"Anisotropic Etching of Crystalline Silicon in Alkaline Solutions" J. Electrochem. Soc., vol. 137, No. 11, Nov. 1990 by Seidel.*
(Continued)

*Primary Examiner* — Moazzam Hossain
*Assistant Examiner* — Farun Lu
(74) *Attorney, Agent, or Firm* — Schwabe, Williamson & Wyatt, P.C.

(57) ABSTRACT

A method of processing a silicon substrate can include etching the silicon substrate with a first etchant having a first concentration and etching with a second etchant having a second concentration. In an embodiment, the second concentration of the second etchant can be greater than the first concentration of the first etchant. In one embodiment, the first etchant can be a different type of etchant than the second etchant. In an embodiment, the first and second etchant can be the same type of etchant. In some embodiments the silicon substrate can be cleaned with a first cleaning solution to remove contaminants from the silicon substrate prior to etching with the first etchant. In an embodiment, the silicon substrate can be cleaned with a second cleaning solution after etching the silicon substrate with a second etchant.

12 Claims, 5 Drawing Sheets

(58) Field of Classification Search
CPC .......... H01L 31/02167; H01L 21/3063; H01L 21/67086; H01L 21/02019; H01L 21/02052; H01L 31/1804; H01L 31/182
See application file for complete search history.

(56) References Cited

U.S. PATENT DOCUMENTS

| | | | |
|---|---|---|---|
| 7,468,485 | B1 | 12/2008 | Swanson |
| 7,812,250 | B2 | 10/2010 | Smith |
| 8,492,253 | B2 | 7/2013 | Manning |
| 8,790,957 | B2 | 7/2014 | Li et al. |
| 2003/0138588 | A1 | 7/2003 | Cabuz et al. |
| 2009/0004876 | A1 | 1/2009 | Koyata et al. |
| 2009/0095346 | A1 | 4/2009 | Hurley et al. |
| 2010/0055822 | A1 | 3/2010 | Weidman et al. |
| 2010/0224251 | A1 | 9/2010 | Funakoshi |
| 2011/0045673 | A1 | 2/2011 | Schweckendiek et al. |
| 2011/0111548 | A1 | 5/2011 | Kashkoush et al. |
| 2011/0124144 | A1 | 5/2011 | Schlemm et al. |
| 2011/0151671 | A1* | 6/2011 | Barr .................. H01L 31/02363 438/695 |
| 2011/0214719 | A1 | 9/2011 | Li et al. |
| 2011/0275222 | A1 | 11/2011 | Sun et al. |
| 2012/0288985 | A1 | 11/2012 | Moriceau et al. |
| 2013/0130508 | A1* | 5/2013 | Wu .................... H01L 21/30604 438/753 |
| 2013/0247967 | A1 | 9/2013 | Harrington |
| 2014/0051199 | A1* | 2/2014 | Muenzer ........... H01L 31/02363 438/57 |
| 2014/0080246 | A1* | 3/2014 | Nakai ............... H01L 31/02363 438/71 |

FOREIGN PATENT DOCUMENTS

| | | |
|---|---|---|
| WO | WO-2009120631 | 10/2009 |
| WO | WO-2011072161 | 6/2011 |
| WO | WO-2011092401 | 8/2011 |

OTHER PUBLICATIONS

European Supplementary Search Report from European Patent Application No. 12871887 dated Mar. 16, 2015, 11 pgs.
Written Opinion from Singapore Patent Application No. 11201405925Q dated Jul. 9, 2015, 8 pgs.
Jochen Rentsch, et al. The Compiled State-of-the-Art of PV Solar Technology and Deployment : 24th European Photovoltaic Solar Energy Conference and Exhibition; Conference Sep. 21-25, 2009, Exhibition Sep. 21-24, 2009 Hamburg; Proceeding, whole docu.
International Search Report and Written Opinion from PCT/US2012/070179 dated Apr. 23, 2013, 11 pgs.
International Preliminary Report on Patentability from PCT/US2012/070179 dated Oct. 2, 2014, 8 pgs.
First Action Interview Office Action from U.S. Appl. No. 13/429,134 dated Dec. 31, 2014, 4 pgs.
First Action Interview Pre-Interview Communication from U.S. Appl. No. 13/429,134 dated Jun. 3, 2015, 5 pgs.
Final Office Action from U.S. Appl. No. 13/429,134 dated Jun. 17, 2015, 20 pgs.
International Search Report and Written Opinion from PCT/US2015/046175 dated Feb. 22, 2016, 14 pgs.
International Preliminary Report on Patentability for PCT Patent Application No. PCT/US2015/46175 dated Mar. 9, 2017, 11 pgs.

* cited by examiner

SEQUENTIAL ETCHING TREATMENT FOR SOLAR CELL FABRICATION

BACKGROUND

Photovoltaic (PV) cells, commonly known as solar cells, are well known devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collect from all of the PV cells can be combined in series and parallel arrangements to provide power with a certain voltage and current.

DETAILED DESCRIPTION

Figure 1:
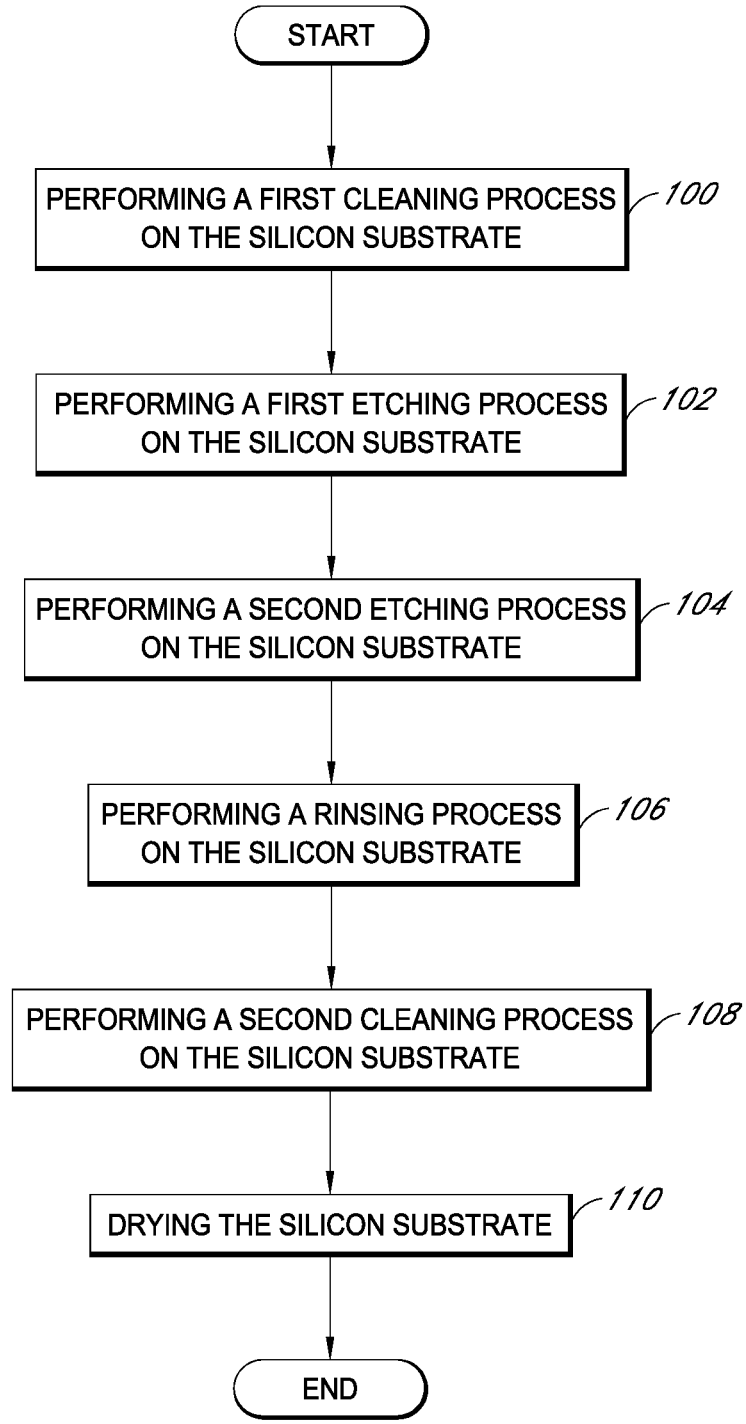
FIG. 1 illustrates a flow chart representation of a method of fabricating solar cell, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" etching process does not necessarily imply that this etching process is the first etching process in a sequence; instead the term "first" is used to differentiate this etching process from another etching process (e.g., a "second" etching process).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

In various embodiments, solar cells can be fabricated from silicon substrates, (e.g., silicon wafers), which can be cut to from silicon ingots. In an example, a slurry cutting process can be used to form a silicon substrate from a silicon ingot. In another example, a diamond wire cutting process can be used to form a silicon substrate from the silicon ingot. Silicon substrates formed in this way can have defects, e.g., cracks or uneven (e.g., non-smooth or rough) surface, after forming the substrate. The defects or rough surface can serve as a recombination region for minority charger carriers in the solar cell, limiting solar cell conversion efficiency.

In some embodiments, an etching process can be performed on a surface region of the silicon substrate to etch away at the defects and/or the rough surface. Surface region is used herein to describe a portion of the silicon substrate with a depth. For example, the surface region can be the top (as viewed as in FIGS. 2-4) 5-40 μm of the silicon substrate. As another non-limiting example, the surface region can be the top (as viewed in FIGS. 2-4) 5-20% of the full depth of the silicon substrate. The etching process can smooth the surface region of silicon substrate, reducing the surface recombination of minority charge carriers and increasing the solar cell efficiency.

This specification first describes an example method for processing a solar cell that can include sequential etching of a silicon substrate, followed by example results and an apparatus for etching a silicon substrate. Various examples are provided throughout.

Turning now to FIG. 1, a flow chart illustrating a method for processing a silicon substrate is shown, according to some embodiments. In various embodiments, the method of FIG. 1 can include additional (or fewer) blocks than illustrated. For example, in some embodiments, a first cleaning process (block 100) need not be performed.

As shown in 100, a first cleaning process can be performed on the silicon substrate. In an embodiment, the first cleaning process can include cleaning the silicon substrate with a first cleaning solution. For example, the first cleaning process can remove contaminants, as described in more detail at FIG. 2, from a surface of the silicon substrate. In an embodiment, the silicon substrate can be cleaned with ozone (e.g., a solution of $O_3$ and deionized (DI) water), hydrogen peroxide ($H_2O_2$), nitric acid ($HNO_3$) or sulfuric acid ($H_2SO_4$), among other examples. In some embodiments, the first cleaning process need not be performed.

In an embodiment, a rinsing process can be performed after the first cleaning process. For example, the first rinsing process can include rinsing the silicon substrate with deionized (DI) water to wash away contaminants and any remaining solution from the first cleaning process. In an embodiment, a rinsing process, e.g., including the use of DI water, can be performed after every cleaning and/or etching step. In other embodiments, rinsing can be performed after some or none of the cleaning and/or etching steps. In an embodiment, an air blower (e.g., forced air, vacuum process) can be used to blow and/or remove contaminants from the silicon substrate.

In some embodiments, the first cleaning process at 100 need not be performed at all. In such embodiments, the rinsing process may only be performed after etching or not at all.

Figure 3:
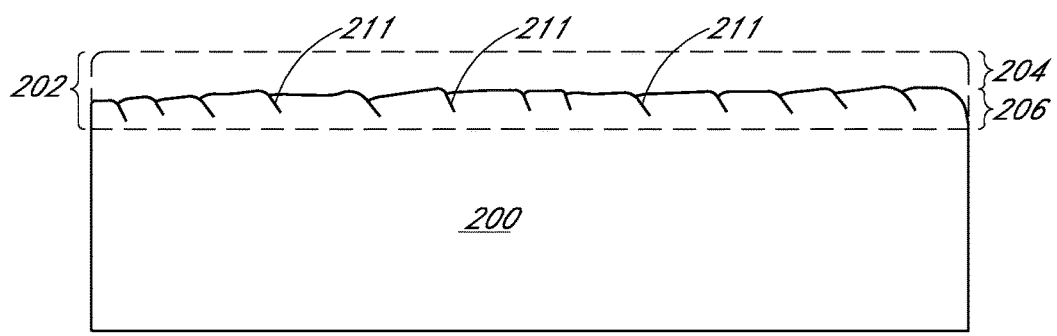

At 102, a first etching process can be performed on the silicon substrate. In an embodiment, the first etching process can include etching the silicon substrate with a first etchant. In some embodiments, the first etchant can be potassium hydroxide (KOH), sodium hydroxide (NaOH), tetramethylammonium hydroxide (TMAH), hydrofluoric acid (HF) and nitric acid ($HNO_3$), hydrofluoric acid (HF) with nitric acid ($HNO_3$) and deionized (DI) water, hydrofluoric acid (HF) with nitric acid ($HNO_3$), acetic acid ($C_2H_4O_2$) and deionized (DI) water, ammonium hydroxide ($NH_4OH$) and/or combinations thereof. In an embodiment, the first etchant can have a first concentration. For example, the silicon substrate can be etched with potassium hydroxide (KOH) having a concentration in the range of approximately 15-30%. In an embodiment, approximately 50-90% of a surface region of the silicon substrate can be etched. FIG. 3 shows an example of performing a first etching process on a silicon substrate, where a surface region of the silicon substrate is etched away. In an embodiment, the first etching process can have an etch rate in the range of 4-12 μm/min.

At 104, a second etching process can be performed on the silicon substrate. In an embodiment, the second etching process can include etching with a second etchant. In some embodiments, the second etchant can be potassium hydroxide (KOH), sodium hydroxide (NaOH), tetramethylammonium hydroxide (TMAH), hydrofluoric acid (HF) and nitric acid ($HNO_3$), hydrofluoric acid (HF) with nitric acid ($HNO_3$) and deionized (DI) water, hydrofluoric acid (HF) with nitric acid ($HNO_3$), acetic acid ($C_2H_4O_2$) and deionized (DI) water, ammonium hydroxide ($NH_4OH$) and/or combinations thereof. In an embodiment, the second etchant can have a concentration greater than the concentration of the first etchant. For example, the silicon substrate can be etched with potassium hydroxide (KOH) having a concentration in the range of approximately 40-50%. In some embodiments, the first etchant can be the same type of etchant as the second etchant (e.g., KOH) but with a lower concentration.

In another embodiment, the first etchant can be a different type of etchant than the second etchant. In the embodiment where the second etchant is different from the first etchant, the second etchant need not be of a higher concentration than the first etchant. For example, the first etchant can be potassium hydroxide (KOH) and/or sodium hydroxide (NaOH) at a lower, same, or higher concentration than the second etchant, which can be tetramethylammonium hydroxide (TMAH) or an HF/HNO3 based etching solution In still another embodiment, only the second etching process is performed. In an example, the second etching process can be performed at a longer etching rate, such as 1 μm/min, to etch away at a surface region, shown in FIGS. 2-4, of the silicon substrate. In an example, a surface region of the silicon substrate can be etched with potassium hydroxide (KOH) having a concentration in the range of approximately 40-50%.

In an embodiment, approximately 10-50% of a surface region of the silicon substrate can be etched. FIG. 3 shows an example of performing a first etching process on a silicon substrate. In an embodiment, the second etching process can have an etch rate in the range of 1-6 μm/min. In an embodiment, the second etching process can also include smoothing and/or polishing a surface of the silicon substrate after etching, such that a finer removal of contaminants and/or defects is performed with the second etching process.

At 106, a rinsing process can be performed on the silicon substrate. For example, the rinsing process can include rinsing the silicon substrate with deionized (DI) water to wash away contaminants and any remaining solution from the second etching process. In an embodiment, a rinsing process can be performed after every cleaning and/or etching step, or after some cleaning and/or etching steps, or after none of the cleaning and/or etching steps. In an embodiment, an air blower (e.g., forced air, vacuum process) can be used to blow and/or remove contaminants from the silicon substrate.

Figure 4:
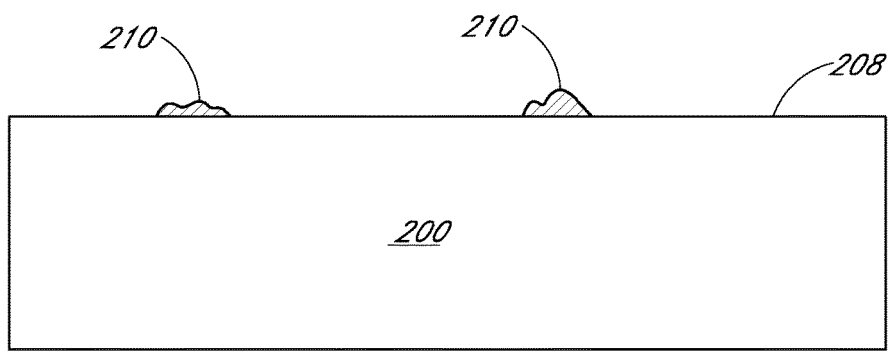

At 108, a cleaning process (which can be the first one if no cleaning occurred at 100) can be performed on the silicon substrate. In an embodiment, the second cleaning process can include cleaning the silicon substrate with a second cleaning solution. For example, the second cleaning process can remove contaminants, as shown in FIG. 4, from a surface of the silicon substrate. In an embodiment, the second cleaning solution can be an organic contaminant remover, a metal contaminant remover, or both an organic and a metal contaminant remover. In an embodiment, an organic and/or metallic contaminant remover can include ozone (e.g., a solution of $O_3$ and deionized (DI) water), hydrogen peroxide ($H_2O_2$), hydrofluoric acid (HF) or hydrogen chloride (HCl).

At 110, the silicon substrate can be dried. For example, the drying process can be performed to remove any remaining moisture from the silicon substrate in preparation for a subsequent process. In an embodiment, the drying process can include staging the silicon substrate in location to wait for any moisture to dry off. In some embodiments, the drying process can be blowing air on the silicon substrate to remove any remaining moisture.

Figure 2:
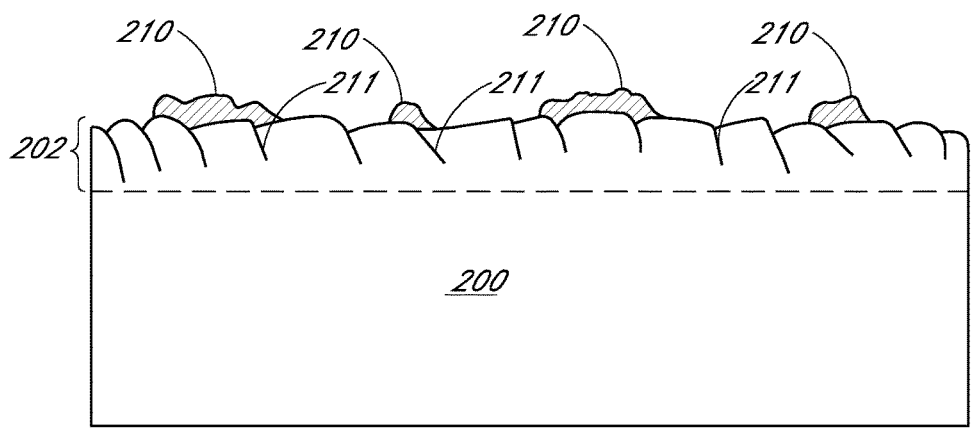
FIGS. 2-4 illustrate a cross-sectional view of a silicon substrate, according to some embodiments.

Turning now to FIGS. 2-4, FIGS. 2-4 illustrate cross-sectional representations of processing a silicon substrate, according to some embodiments. As shown in FIG. 2, a surface region 202 of the silicon substrate 200 can be rough and/or unprocessed. In addition to or instead of rough or unprocessed areas, the surface region 202 can have cracks 211. The rough surface areas and/or cracks 211 of the surface region 202 can serve as a recombination region for minority charge carriers in the solar cell, limiting solar cell conversion efficiency. For example, slurry cutting and/or diamond wire cutting processes can be abrasive, thus forming uneven/rough surfaces, cracks, etc., on a silicon substrate. In some embodiments, the silicon substrate 200 can have contaminants 210, such as metallic and/or organic contaminants, from a prior slurry cutting process, diamond wire cutting process or from handling the silicon substrate.

In an embodiment, a first cleaning process can be performed on the silicon substrate 200 with a first cleaning solution. In some embodiments, the first cleaning solution can be ozone (e.g., a solution of $O_3$ and deionized (DI) water), hydrogen peroxide ($H_2O_2$), nitric acid ($HNO_3$) or sulfuric acid ($H_2SO_4$). In some embodiments, the first cleaning process need not be performed. In an embodiment, a rinsing process can be performed after the first cleaning process, for example, with deionized (DI) water.

As described herein, an etching process can be performed on the surface region 202 of the silicon substrate 200 to at least partially etch away surface defects (e.g., rough portions, cracks, etc.). The etching process can also smooth the surface region of silicon substrate in preparation for one or more subsequent solar cell fabrication processes.

With reference to FIG. 3, a silicon substrate after a first etching process is shown, according to some embodiments. In an embodiment, a first etching process with a first etchant can be performed to etch away a portion 204 from the surface region 202 of the silicon substrate 200. In some embodiments, the first etchant can be potassium hydroxide (KOH), sodium hydroxide (NaOH), tetramethylammonium hydroxide (TMAH), hydrofluoric acid (HF) and nitric acid ($HNO_3$), hydrofluoric acid (HF) with nitric acid ($HNO_3$) and deionized (DI) water, hydrofluoric acid (HF) with nitric acid ($HNO_3$), acetic acid ($C_2H_4O_2$) and deionized (DI) water, ammonium hydroxide ($NH_4OH$), and/or combinations thereof. In an embodiment, the first etchant can have a first concentration. In an example, the silicon substrate 200 can be etched with potassium hydroxide (KOH) having a concentration in the range of approximately 15-30%. In an embodiment, approximately 50-90% of the surface region 202 of the silicon substrate 200 can be etched (e.g., 204 of FIG. 3). In an embodiment, the first etching process can have an etch rate in the range of 4-12 μm/min. In an embodiment, another portion 206 of the surface region 202 of the silicon substrate 200 is not etched after the first etching process and can either be left as is, or can be further etched by a second etching process, as described herein.

FIG. 4 illustrates the silicon substrate after a second etching process, according to some embodiments. In an embodiment, a second etching process with a second etchant can be performed to etch away another portion 206 from the surface region 202 of the silicon substrate 200. In some embodiments, the second etchant can include potassium hydroxide (KOH), sodium hydroxide (NaOH), tetramethylammonium hydroxide (TMAH), hydrofluoric acid (HF) and nitric acid ($HNO_3$), hydrofluoric acid (HF) with nitric acid ($HNO_3$) and deionized (DI) water, hydrofluoric acid (HF) with nitric acid ($HNO_3$), acetic acid ($C_2H_4O_2$) and deionized (DI) water, ammonium hydroxide ($NH_4OH$) and/or combinations thereof. In an embodiment, the second etchant can have a second concentration greater than the first concentration. For example, the silicon substrate can be etched with potassium hydroxide (KOH) having a concentration in the range of approximately 40-50%. In some embodiments, the first etchant can be the same as the second etchant (e.g. KOH). In another embodiment, the first etchant can be different from the second etchant. In an embodiment, approximately 10-50% of a surface region 202 of the silicon substrate 200 can be etched. In an embodiment, the second etching process can have an etch rate in the range of 1-6 μm/min. In an embodiment, the second etching process can also include smoothing a surface 208 of the silicon substrate 200.

In some embodiments, a second cleaning process including a second cleaning solution can be performed on the silicon substrate 200 after the second etching process. For example, the second cleaning process can remove contaminants 210 from a surface 208 of the silicon substrate 200. In an embodiment, the silicon substrate 200 can be cleaned with an organic contaminant remover, a metal contaminant remover, or both an organic and a metal contaminant remover. In an embodiment, an organic and/or metallic contaminant remover can include ozone (e.g., a solution of $O_3$ and deionized (DI) water), hydrogen peroxide ($H_2O_2$), hydrofluoric acid (HF) or hydrogen chloride (HCl). Subsequently, the silicon substrate 200 can be dried to remove any remaining moisture from the silicon substrate in preparation for a subsequent process.

Figure 5:
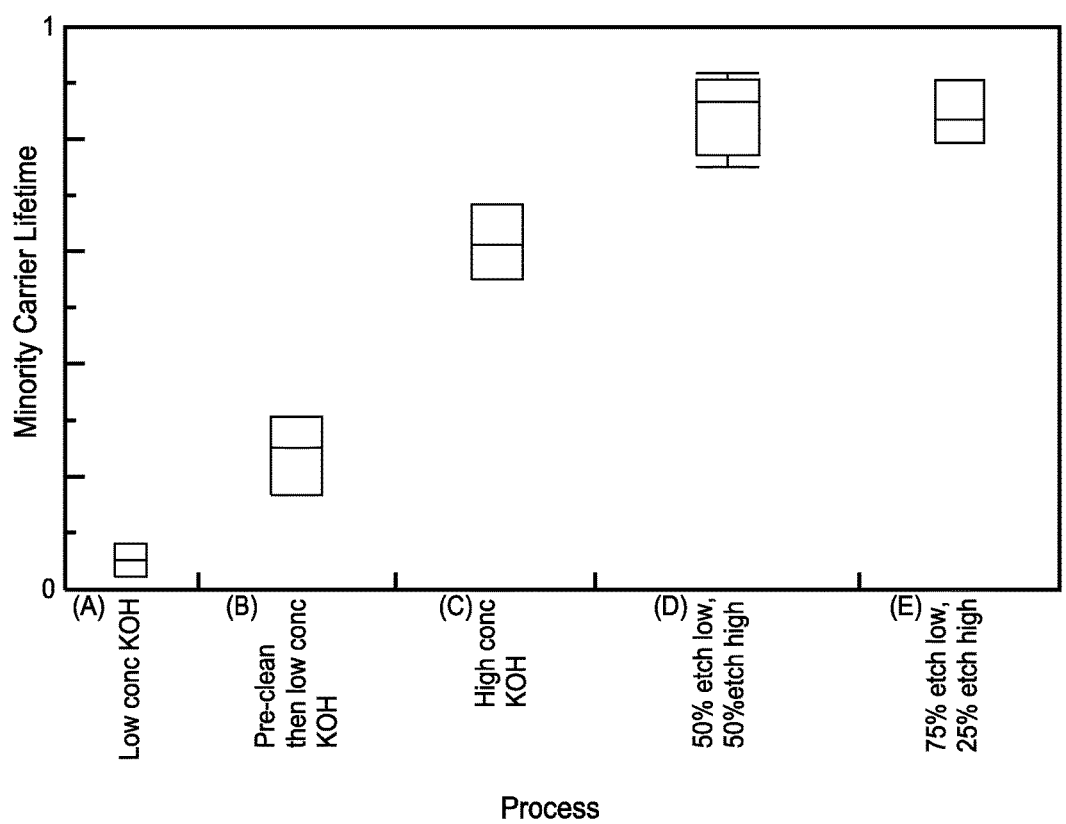
FIG. 5 illustrates a graph of different etching processes to minority carrier lifetime of a solar cell, according to some embodiments.

With reference to FIG. 5, a graph illustrating measured minority carrier lifetime of the solar cell after fabrication for different etching processes on a silicon substrate is shown. In general higher minority carrier lifetime allows for a greater probability that electron and hole pairs migrate to p-doped and n-doped regions in the silicon substrate, thereby increasing the overall solar cell conversion efficiency. The minority carrier lifetime shown in FIG. 5 is normalized from 0 to 1. Five etching processes are compared, (A) etching the silicon substrate with a lower concentration potassium hydroxide (KOH), (B) performing a pre-clean (e.g., with ozone) followed by etching the silicon substrate with a lower concentration potassium hydroxide (KOH), (C) etching a surface region of the silicon substrate with a higher concentration potassium hydroxide (KOH), (D) etching 50% of a surface region of the silicon substrate (e.g., 204 of FIG. 3) with a lower concentration (e.g., 15-30%) potassium hydroxide (KOH) and etching the remaining 50% of a surface region of the silicon substrate (e.g., 206 of FIG. 3) with a higher concentration (e.g., 40-50%) potassium hydroxide (KOH), and (E) etching 75% of a surface region of the silicon substrate (e.g., 204 of FIG. 3) with a lower concentration (e.g., 15-30%) potassium hydroxide (KOH) and etching the remaining 25% of a surface region of the silicon substrate (e.g., 206 of FIG. 3) with a higher concentration (e.g., 40-50%) potassium hydroxide (KOH). The sequential etching processes of (D) and (E) have the highest minority carrier lifetime results as shown in FIG. 5. The etching process (C) with the higher concentration potassium hydroxide (KOH) resulted in the second highest minority carrier lifetime to the sequential etching processes (D) and (E). In an example, etching with a higher concentration potassium hydroxide (KOH) alone can take longer, e.g., the higher concentration potassium hydroxide (KOH) alone can have a longer etch rate as compared to both the sequential processes (D) and (E). Etching with both the lower concentration potassium hydroxide (KOH), with (B) and without pre-clean (A) resulted in approximately the lowest minority charge carrier results. Therefore, sequential etching processes, for example the etching processes (D) and (E), have a benefit of improved minority carrier lifetime and/or increasing the overall solar cell conversion efficiency as compared to single etching processes (e.g., the single etching processes (A), (B) and (C)).

Figure 6:
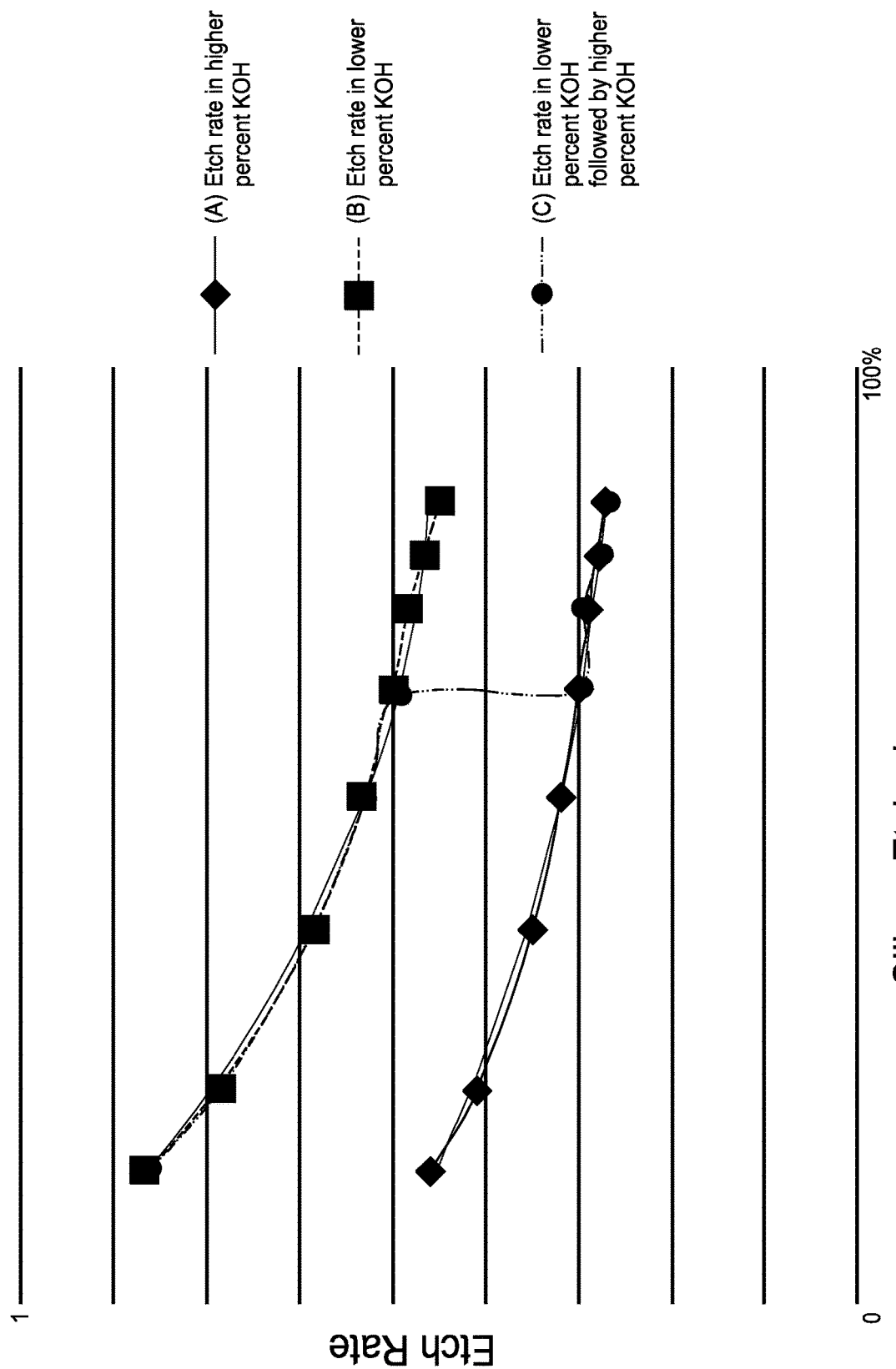
FIG. 6 illustrates a graph of etched silicon with respect to etch rate, according to some embodiments.

FIG. 6 illustrates a graph of etched silicon with respect to etch rate for different etching processes on a silicon substrate. Lower etch rates allow for a higher unit per hour (UPH) processing for silicon substrates, thereby increasing the output that silicon substrates can be processed for solar cell fabrication and/or manufacture. Greater output can provide for more solar cells manufactured, and reduced manufacturing costs. FIG. 6 shows a normalized etch rate from 0 to 1 and approximates the total silicon etched of a surface region of the silicon substrate, e.g., etching 0-100% of 202 of FIG. 3. Referring to FIG. 6 three etch rates are compared, including (a) the etch rate in a higher concentration etchant, (b) the etch rate in a lower concentration etchant and (c) the combined etch rate for etching with a lower concentration etchant followed by a higher concentration etchant. In an example, for FIG. 6 potassium hydroxide (KOH) is used as the etchant. Referring to FIG. 6, for the higher concentration etching process (a), the etch rate can initially start rapidly and slow steadily as more of the silicon is etched. For the lower concentration etching process (b), the etch rate can be faster than the etch rate for (a) for all silicon etching depths. For the sequential etching process (c), the combined etch rate can be faster than the etch rate for the higher concentration etchant (a) and approximately comparable (e.g., close-to) the etch rate of the lower concentration etchant (b).

As shown in FIG. 5, lifetime results for etching with a lower concentration etchant alone are lower, thus using a sequential etching process with an etch rate closer to that of the lower concentration etchant provides for the benefit of a faster etch rate with improved overall lifetime (e.g., closer to that of a higher concentration etchant alone), and therefore, improved solar cell efficiency.

Figure 7:
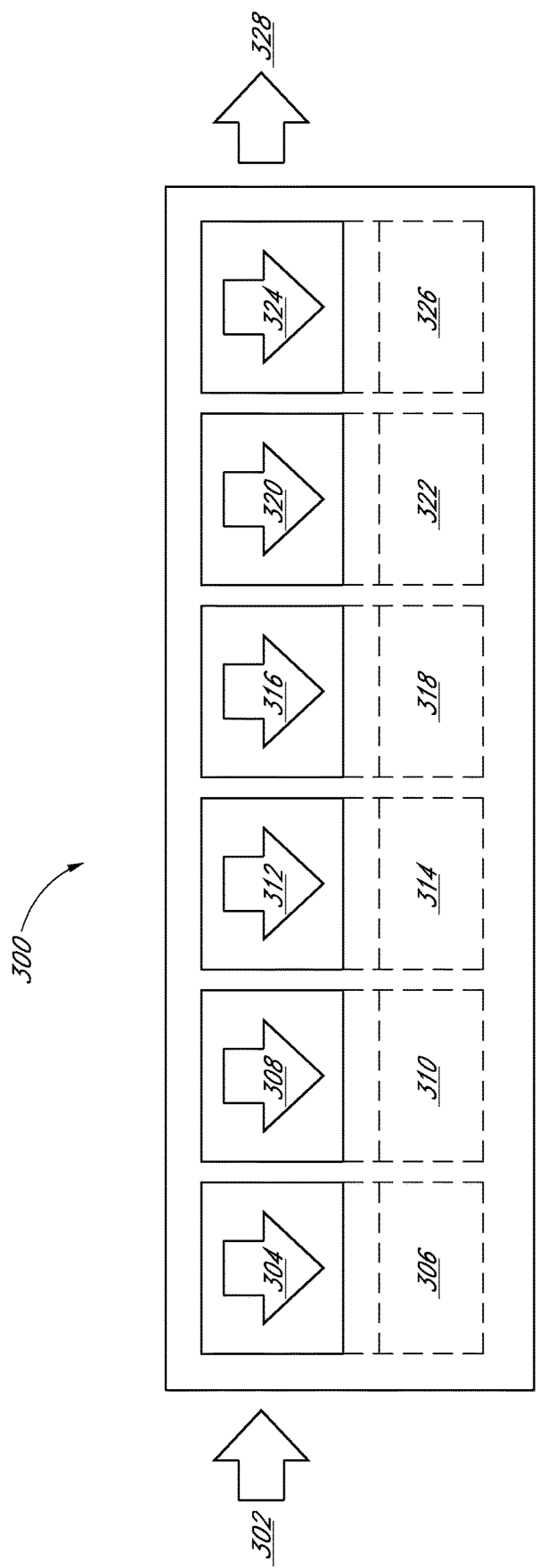
FIG. 7 illustrates an example etching tool, according to some embodiments.

With reference to FIG. 7, there is shown an example etching tool, according to some embodiments. In an embodiment, the example etching tool 300 can be a linear etching tool having multiple baths (e.g., an etching tool for batch processing). In another embodiment, an example etching tool with a single bath can be used.

Referring to FIG. 7, a silicon substrate can be loaded 302 into the etching tool 300.

In one embodiment, the silicon substrate can be placed 304 in a first cleaning bath 306 to clean the silicon substrate with a first cleaning solution. In an embodiment, the first cleaning solution can be an ozone solution, hydrogen peroxide ($H_2O_2$), nitric acid ($HNO_3$) or sulfuric acid ($H_2SO_4$). In some embodiments, the first cleaning process, including placing the silicon substrate in the first cleaning bath, need not be performed, and may not be part of tool 300.

In some embodiments, the silicon substrate can be placed 308 in a first rinsing bath 310. For example, the rinsing process can include rinsing the silicon substrate with deionized (DI) water to wash away contaminants and any remaining solution from the first cleaning process. In some embodiments, the silicon substrate need not be rinsed and/or placed 308 in a first rinsing bath 310. In some embodiments, a rinse can follow every cleaning and etch step.

In some embodiments, the silicon substrate can be placed 312 in a first etchant bath 314. In an embodiment, the silicon substrate can be etched in the first etchant bath 314 with a first etchant having a first concentration. In some embodiments, the first etchant can be potassium hydroxide (KOH), sodium hydroxide (NaOH), tetramethylammonium hydroxide (TMAH), hydrofluoric acid (HF) and nitric acid ($HNO_3$), hydrofluoric acid (HF) with nitric acid ($HNO_3$) and deionized (DI) water, hydrofluoric acid (HF) with nitric acid ($HNO_3$), acetic acid ($C_2H_4O_2$) and deionized (DI) water, ammonium hydroxide ($NH_4OH$) and/or combinations thereof. In an example, the silicon substrate can be etched with potassium hydroxide (KOH) having a concentration in the range of approximately 15-30%. In an embodiment, approximately 50-90% of a surface region of the silicon substrate can be etched. In some embodiments, the etching removes contaminants from the silicon substrate, where the contaminants can be collected and/or removed from the first etchant bath 314. In an embodiment, etching with the first etchant can at least partially smooth a surface of the silicon substrate. In some embodiments, etching with the first etchant in a first etchant bath 314 can remove more contaminants than subsequently etching the silicon substrate in a second etchant bath.

In general, maintaining, e.g., refilling and/or replacing, a higher concentration etchant in a bath, can be more expensive. In an embodiment, collecting more contaminants in the first bath 314 can provide for significant cost savings, where only a first bath having a lower concentration etchant need be more closely maintained (e.g., refilled, replaced, etc.) as compared to maintaining a bath with a higher concentration etchant.

The silicon substrate can be placed 316 in a second etchant bath 318. In an embodiment, the silicon substrate can be etched in the second etchant bath 318 with a second etchant having a second concentration. In some embodiments, the first etchant can be potassium hydroxide (KOH), sodium hydroxide (NaOH), tetramethylammonium hydroxide (TMAH), hydrofluoric acid (HF) and nitric acid ($HNO_3$), hydrofluoric acid (HF) with nitric acid ($HNO_3$) and deionized (DI) water, hydrofluoric acid (HF) with nitric acid ($HNO_3$), acetic acid ($C_2H_4O_2$) and deionized (DI) water, ammonium hydroxide ($NH_4OH$) and/or combinations thereof. In an embodiment, the concentration of the second etchant can be higher than the concentration of the first etchant. For example, the silicon substrate can be etched with potassium hydroxide (KOH) having a concentration in the range of approximately 40-50%. In an embodiment, approximately 10-50% of a surface region of the silicon substrate can be etched. In another embodiment, the first etchant can be a different type of etchant than the second etchant. In some embodiments, the etching removes contaminants from the silicon substrate, where the contaminants can be collected and/or removed from the second etchant bath 318. In an embodiment, the etching can remove other contaminants from the silicon substrate and where the etching with the second etchant can at least partially smooth a surface of the silicon substrate.

The silicon substrate can be placed 320 in a second cleaning bath 322 to clean the silicon substrate with a second cleaning solution. In an embodiment, the solution such can be an organic contaminant remover, a metal contaminant remover, or both an organic and a metal contaminant remover. In an embodiment, an organic and/or metallic contaminant remover can include ozone (e.g., a solution of $O_3$ and deionized (DI) water), hydrogen peroxide ($H_2O_2$), hydrofluoric acid (HF) or hydrogen chloride (HCl). In some embodiments, the second cleaning process, including placing the silicon substrate in the second cleaning bath, need not be performed.

The silicon substrate can be placed 324 in a first rinsing bath 326. For example, the rinsing process can include rinsing the silicon substrate with deionized (DI) water to wash away contaminants and any remaining solution from the second cleaning process. In some embodiments, the silicon substrate need not be rinsed and/or placed 324 in a second rinsing bath 326. In an embodiment, an air blower (e.g., forced air, vacuum process) can be used to blow and/or remove contaminants from the silicon substrate.

The silicon substrate can be dried to remove any remaining moisture from the silicon substrate in preparation for a subsequent process (e.g., another solar cell fabrication process).

The silicon substrate can be unloaded 328 from the etching tool 300.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of processing a silicon substrate, the method comprising:
   etching the silicon substrate with a first etchant having a first concentration;
   subsequent to etching the silicon substrate with the first etchant having the first concentration, etching the silicon substrate with a second etchant having a second concentration higher than the first concentration, wherein etching the silicon substrate with the first and second etchant comprises etching the silicon substrate with hydrofluoric acid (HF) and nitric acid ($HNO_3$), or etching the silicon substrate with hydrofluoric acid (HF) and nitric acid ($HNO_3$) and acetic acid ($C_2H_4O_2$), wherein the concentration of the components of the second etchant are greater in concentration than the corresponding components of the first etchant and wherein the first and second etchants are both acidic etchants; and
   immediately following the etching the silicon substrate with the both acidic etchants, cleaning the silicon substrate with a cleaning solution that is an organic contaminant remover, a metal contaminant remover, or both an organic and a metal contaminant remover, the cleaning solution comprising a solution of ozone and deionized water or comprising hydrogen peroxide.

2. The method of claim 1, wherein etching the silicon substrate with the first etchant comprises etching the silicon substrate at an etch rate in the range of 4-12 µm/min.

3. The method of claim 1, wherein etching the silicon substrate with the second etchant comprises etching the silicon substrate at an etch rate in the range of 1-6 µm/min.

4. The method of claim 1, wherein etching the silicon substrate with the first and second etchant comprises etching the silicon substrate with hydrofluoric acid (HF) and nitric acid ($HNO_3$).

5. The method of claim 1, wherein etching the silicon substrate with the first and second etchant comprises etching the silicon substrate with hydrofluoric acid (HF) and nitric acid ($HNO_3$) and acetic acid ($C_2H_4O_2$).

6. A method of processing a silicon substrate, the method comprising:
   cleaning the silicon substrate with a first cleaning solution, wherein cleaning the silicon substrate with the first cleaning solution removes contaminants from the silicon substrate, and wherein cleaning the silicon substrate with first cleaning solution comprises cleaning the silicon substrate with nitric acid ($HNO_3$) or sulfuric acid ($H_2SO_4$);
   etching the silicon substrate with a first etchant having a first concentration;
   subsequent to etching the silicon substrate with the first etchant having the first concentration, etching the silicon substrate with a second etchant having a second concentration greater than the first concentration, wherein etching the silicon substrate with the first and second etchant comprises etching the silicon substrate with hydrofluoric (HF) and nitric acid ($HNO_3$), or comprises etching the silicon substrate with hydrofluoric acid (HF) and nitric acid ($HNO_3$) and acetic acid ($C_2H_4O_2$), wherein the concentration of the components of the second etchant are greater in concentration than the corresponding components of the first etchant, and wherein the first and second etchants are both acidic etchants; and
   immediately following the etching the silicon substrate with the both acidic etchants, cleaning the silicon substrate with a second cleaning solution, wherein cleaning the silicon substrate with the second cleaning solution comprises cleaning the silicon substrate with an organic contaminant remover, a metal contaminant remover, or both an organic and a metal contaminant remover, the second cleaning solution comprising a solution of ozone and deionized water or comprising hydrogen peroxide.

7. The method of claim 6, wherein etching the silicon substrate with the first and second etchant comprises etching the silicon substrate with hydrofluoric acid (HF) and nitric acid ($HNO_3$).

8. The method of claim 6, wherein etching the silicon substrate with the first and second etchant comprises etching the silicon substrate with hydrofluoric acid (HF) and nitric acid ($HNO_3$) and acetic acid ($C_2H_4O_2$).

9. A method of processing a silicon substrate, the method comprising:
   cleaning a silicon substrate with nitric acid ($HNO_3$) or sulfuric acid ($H_2SO_4$);
   subsequent to cleaning the silicon substrate, placing the silicon substrate in a first etchant bath;
   etching the silicon substrate in the first etchant bath with a first etchant having a first concentration, wherein the etching with the first etchant having a first concentration removes contaminants from the silicon substrate placing the silicon substrate in a second etchant bath;

subsequent to etching the silicon substrate with the first etchant having the first concentration, etching the silicon substrate in the second etchant bath with a second etchant having a second concentration, wherein the first concentration is lower than the second concentration, wherein the etching with the second etchant having a second concentration removes other contaminants from the silicon substrate, wherein etching with the first and second etchants at least partially smooths a surface of the silicon substrate, wherein etching the silicon substrate with the first and second etchant comprises etching the silicon substrate with hydrofluoric acid (HF) and nitric acid ($HNO_3$), or comprises etching the silicon substrate with hydrofluoric acid (HF) and nitric acid ($HNO_3$) and acetic acid ($C_2H_4O_2$), wherein the concentration of the components of the second etchant are greater in concentration than the corresponding components of the first etchant, and wherein the first and second etchants are both acidic etchants; and immediately following the etching the silicon substrate with the both acidic etchants, cleaning the silicon substrate with a cleaning solution that is an organic contaminant remover, a metal contaminant remover, or both an organic and a metal contaminant remover, the cleaning solution comprising a solution of ozone and deionized water or comprising hydrogen peroxide.

10. The method of claim 9, wherein etching the silicon substrate in the first etchant bath with the first etchant having a first concentration removes more contaminants than etching the silicon substrate in the second etchant bath.

11. The method of claim 9, wherein etching the silicon substrate with the first and second etchant comprises etching the silicon substrate with hydrofluoric acid (HF) and nitric acid ($HNO_3$).

12. The method of claim 9, wherein etching the silicon substrate with the first and second etchant comprises etching the silicon substrate with hydrofluoric acid (HF) and nitric acid ($HNO_3$) and acetic acid ($C_2H_4O_2$).

* * * * *